(12) United States Patent
Kondo et al.

(10) Patent No.: US 9,112,069 B2
(45) Date of Patent: Aug. 18, 2015

(54) SOLAR CELL COMPRISING A P-DOPED SILICON WAFER AND AN ALUMINUM ELECTRODE

(71) Applicant: E I DU PONT DE NEMOURS AND COMPANY, Wilmington, DE (US)

(72) Inventors: Takeshi Kondo, Kanagawa (JP); Akira Inaba, Kawasaki (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 401 days.

(21) Appl. No.: 13/854,349

(22) Filed: Apr. 1, 2013

(65) Prior Publication Data

US 2014/0290729 A1 Oct. 2, 2014

(51) Int. Cl.
*H01L 31/0224* (2006.01)
*H01L 31/18* (2006.01)

(52) U.S. Cl.
CPC .... *H01L 31/022425* (2013.01); *H01L 31/1804* (2013.01); *Y02E 10/547* (2013.01)

(58) Field of Classification Search
CPC ............................ H01L 31/0224; H01L 31/18
USPC .................................. 136/251, 252, 256, 261
See application file for complete search history.

(56) References Cited

U.S. PATENT DOCUMENTS 7,771,623 B2     8/2010   Young et al.
2010/0127221 A1* 5/2010   Weinert et al. ............... 252/500

FOREIGN PATENT DOCUMENTS

JP   2007266327   11/2007
JP   2010258167   11/2010

* cited by examiner

*Primary Examiner* — Susan D Leong

(57) ABSTRACT

A solar cell comprising a p-doped silicon wafer, wherein the p-doped silicon wafer comprises a light-receiving side and a back side; and an aluminum electrode formed on the back side of the silicon wafer; wherein the aluminum electrode comprises an aluminum base layer formed adjacently on the back side of the silicon wafer and an aluminum cover layer formed on the aluminum base layer, and wherein the aluminum cover layer comprises aluminum and boron oxide ($B_2O_3$).

16 Claims, 1 Drawing Sheet

SOLAR CELL COMPRISING A P-DOPED SILICON WAFER AND AN ALUMINUM ELECTRODE

FIELD OF THE INVENTION

The present invention is directed to a solar cell comprising a p-doped silicon wafer and an aluminum electrode.

TECHNICAL BACKGROUND OF THE INVENTION

A conventional solar cell structure with a p-type (p-doped) base has a negative electrode that is typically on the front-side or sun side of the cell and a positive electrode on the back-side.

During the formation of a silicon solar cell, an aluminum paste is generally screen printed and dried on the back-side of the silicon wafer. The wafer is then fired at a temperature above the melting point of the eutectic point of aluminum and silicon to form an aluminum-silicon melt. Subsequently, during the cooling phase, an epitaxially grown layer of silicon is formed that is doped with aluminum. This layer is generally called the back surface field (BSF) layer, and helps to improve the energy conversion efficiency of the solar cell.

Most electric power-generating solar cells currently used are silicon solar cells. Process flow in mass production is generally aimed at achieving maximum simplification and minimizing manufacturing costs. Electrodes in particular are made by using a method such as screen printing from a metal paste.

In recent years, attention has been focused on improving the ability of silicon wafers for solar cells to convert solar energy into electrical energy, and a variety of attempts have been made to improve the electrical characteristics, such as the open circuit voltage (Voc), of back-side aluminum electrode. For example, attempts have been made to improve electrical characteristics by incorporating glass in an aluminum paste for forming a back-side aluminum electrode film, as disclosed in U.S. Pat. No. 7,771,623.

SUMMARY OF THE INVENTION

In one aspect, the present invention relates to a solar cell comprising a p-doped silicon wafer, wherein the p-doped silicon wafer comprises a light-receiving side and a back side; and an aluminum electrode formed on the back side of the silicon wafer; wherein the aluminum electrode comprises an aluminum base layer formed adjacently on the back side of the silicon wafer and an aluminum cover layer formed on the aluminum base layer, and wherein the aluminum cover layer comprises aluminum and boron oxide ($B_2O_3$). In another aspect, the present invention relates to a method for manufacturing a solar cell, comprising the steps of preparing a p-doped silicon wafer, wherein the p-doped silicon wafer comprises a light-receiving side and a back side; applying a first aluminum paste comprising aluminum on the back side of the p-doped wafer; applying a second aluminum paste comprising aluminum and boron compound; and firing the first aluminum paste and the second aluminum paste to form an aluminum electrode comprising an aluminum base layer and an aluminum cover layer that derives from the first aluminum paste and the second aluminum paste respectively, wherein the boron compound is oxidized to boron oxide ($B_2O_3$) during the firing.

The aluminum cover layer contains boron oxide, which is generated by boron or a boron compound being oxidized in the firing process, at the aforementioned weight ratio relative to aluminum. As a result, the obtained aluminum electrode is formed due to oxidation of aluminum being effectively suppressed. Therefore, a solar cell having excellent electrical characteristics is provided.

BRIEF DESCRIPTION OF THE FIGURES

FIG. 1A shows a sectional view of silicon wafer 102 and electrodes 104 formed on the light-receiving side of silicon wafer 102. FIG. 1B shows an embodiment where Al paste 106 is printed on the back side of silicon wafer 102. FIG. 1C shows an embodiment where both of Al paste 106 and Ag paste 108 are printed. FIG. 1D shows the obtained solar cell, after firing.

In FIG. 1D, back-side aluminum electrode 110 is adjacently formed on silicon wafer 102 and comprises aluminum base layer 110a and aluminum cover layer 110b.

DETAILED DESCRIPTION OF THE INVENTION

Figure 1A:
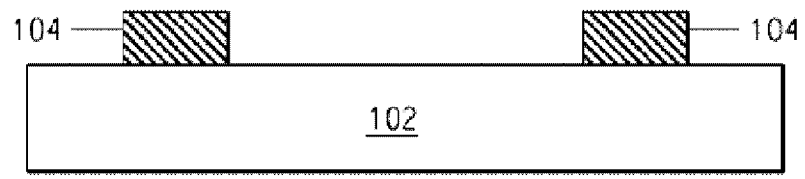
FIG. 1A-1D illustrates a process for manufacturing a solar cell comprising a p-doped silicon wafer and an aluminum electrode.

The present invention is explained in detail below.

A Solar Cell

In one embodiment, the solar cell comprises a p-doped silicon wafer and an aluminum electrode.

Aluminum Electrode

In one embodiment, the aluminum electrode is formed on the back side of the silicon wafer. In one embodiment, the aluminum electrode comprises an aluminum base layer and an aluminum cover layer.

In one embodiment, the aluminum base layer formed adjacently on the back side of the silicon wafer and the aluminum cover layer formed on the aluminum base layer comprises aluminum and boron oxide ($B_2O_3$). In another embodiment, the aluminum cover layer formed on the aluminum base layer comprises aluminum and boron oxide ($B_2O_3$) while the aluminum base layer is substantially free of boron oxide. "Substantially free of boron oxide" herein means boron oxide is not intentionally included beyond the level of impurity. More specifically, boron oxide is included at less than 0.1 wt % in an embodiment, at less than 0.01 wt % in another embodiment, and at less than 0.001 wt % in another embodiment, based on the total weight of the aluminum base layer.

Aluminum Base Layer

In one embodiment, the aluminum base layer is formed from the first aluminum paste comprising aluminum powder.

First Aluminum Paste

Aluminum Powder

In one embodiment, the first aluminum paste comprises aluminum powder. The aluminum powder comprises atomized aluminum in an embodiment. The atomized aluminum may be atomized in either the air or an inert atmosphere.

In one embodiment, a mean particle size (D50) of the atomized aluminum powder is in the range of 0.5 to 20 μm. In one embodiment, the mean particle size (D50) of the aluminum powder is in the range of 1 to 10 μm. The shape of the aluminum powder is not particularly limited. In an embodiment, spherical or flakey shape may be used. The aluminum powder contains aluminum metal in the amount of 85 wt % or more of the powder. In an embodiment, the aluminum powder may be further accompanied by other additive materials, such as, Mg, Ti, Cr, Mo, W, Mn, Ni, Cu, Ag, Zn, Si, Bi, Sb, Fe and a mixture thereof.

In one embodiment, the content of the aluminum powder in the first aluminum paste is 60 to 85 wt %. In another embodiment, the content is 65 to 80 wt %. In another embodiment, the content is 70 to 80 wt %. If the content of the aluminum powder is 60 wt % or higher, an aluminum coating film is formed at a thickness that enables a reaction between silicon and aluminum to take place satisfactorily. As a result, a good BSF layer is formed. In addition, if the content of the aforementioned aluminum powder is not higher than 85 wt %, a paste having a suitable viscosity for printing is obtained.

Grass Frit, Organic Medium and Other Additives

In one embodiment, the first aluminum paste may comprise glass frit, organic medium and other additives, such as, surfactants, thickeners, rheology modifiers and stabilizers as explained below as additives.

Glass Frit

Generally, the function of the glass frit in an aluminum paste is primarily to provide a means to increase the efficiency by which the silicon is accessed by the molten aluminum during the firing process. In addition to this function, the glass frit provides some additional cohesion and adhesion properties to the substrate. The glass frit affects the bowing of the aluminum electrode in the finished cell. The glass frit can also increase the alloying depth of the aluminum into the silicon, therefore enhancing or increasing the aluminum silicon layer.

The glass frit is, in one embodiment, chosen based on the effectiveness that they have on improving the electrical performance of the aluminum paste without compromising other considerations such as environmental legislation or public desire to exclude heavy metals of potential environmental concern.

Useful glass frits are known in the art. Some examples include borosilicate and aluminosilicate glasses. Specifically, it is possible to use a glass frit having $B_2O_3$—$SiO_2$-based, $Bi_2O_3$-based or $B_2O_3$—$SiO_2$—$PbO$-based glass composition that contains, for example, a group IV-A element such as Ti or Zr, a group V-A element such as V, Nb or Ta, a group I-B element such as Ag or Cu, a group II-B element such as Zn or Cd, a group III-B element such as Al, Ga or In or a group I-B element such as Ge or Sn in addition to an alkali metal or alkaline earth metal oxide or fluoride. It is possible to use one or two or more types of these glass frits in the aluminum paste.

In one embodiment, the mean particle size (D50) of the glass frit composition 0.1-8 μm. The reason for this is that smaller particles having a high surface area tend to adsorb the organic materials and thus impede clean decomposition. On the other hand, larger size particles tend to have poorer sintering characteristics.

Organic Medium

A wide variety of inert viscous materials can be used as organic medium. The rheological properties of the organic medium is such that they lend good application properties to the composition, including: stable dispersion of solids, appropriate viscosity and thixotropy for screen printing, appropriate wettability of the substrate and the paste solids, a good drying rate, and good firing properties.

The organic medium which can be used in the first aluminum paste is a non-aqueous inert liquid in an embodiment. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents are ester alcohols and terpenes such as alpha- or beta-terpineol and mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the organic medium. Various combinations of these and other solvents are formulated to obtain the viscosity and volatility requirements desired.

The content of polymer present in the organic medium is in the range 0.5 weight percent to 11 weight percent of the total composition. The first aluminum paste used in the present invention may be adjusted to a predetermined, screen-printable viscosity with the organic polymer containing medium.

In one embodiment, the content (wt %) of the organic medium is 17 to 70 wt % per 100 wt % of the aluminum powder. In another embodiment, the content (wt %) of the organic medium is preferably 25 to 40 wt % per 100 wt % of the aluminum powder. If the content (wt %) is no less than 17 wt % per 100 wt % of the aluminum powder, a suitable viscosity for printing can be obtained. On the other hand, if the content (wt %) is no more than 70 wt % per 100 wt % of the aluminum powder, a good BSF layer can be formed because the film thickness will be smaller after the aluminum paste is printed, resulting in an insufficient reaction phase between the silicon and aluminum.

Other Additives

The first aluminum paste may further comprise one or more other organic additives, such as, surfactants, thickeners, rheology modifiers and stabilizers. The organic additive(s) may be part of the organic medium. However, it is also possible to add the organic additive(s) separately when preparing the aluminum pastes. The organic additive(s) may be present in the aluminum pastes of the present invention in a total proportion of, for example, 0 to 10 wt %, based on total aluminum paste composition.

In an embodiment, the first aluminum paste is substantially free of boron compound. "Substantially free of boron compound" herein means boron compound is not intentionally included beyond the level of impurity. More specifically, boron compound is included at less than 0.1 wt % in total in an embodiment, at less than 0.01 wt % in another embodiment, and at less than 0.001 wt % in another embodiment, based on the total weight of the first aluminum paste.

The conductive component (aluminum paste) explained above is typically conveniently manufactured by mechanically mixing, a dispersion technique that is equivalent to the traditional roll milling. Roll milling or other mixing technique can also be used. The conductive component is preferably spread on the desired part of the back face of a solar cell by screen printing; in spreading by such a method, it is preferable to have a viscosity in a prescribed range. Other application methods can be used such as silicone pad printing. The viscosity of the aluminum paste is preferably 20-100 Pa·s when it is measured at a spindle speed of 10 rpm and 25° C. by a utility cup using a Brookfield HBT viscometer and #14 spindle.

Aluminum Cover Layer

As mentioned above, in one embodiment, the aluminum cover layer formed on the aluminum base layer, comprises aluminum and $B_2O_3$. In one embodiment, the weight ratio (aluminum/$B_2O_3$) in aluminum cover layer is 100/192-100/3.2. In another embodiment, the weight ratio of (aluminum/$B_2O_3$) in aluminum cover layer is 100/80-100/3.2. Here, if the aforementioned weight ratio (aluminum/$B_2O_3$) is 100/3.2 or lower, oxidation of aluminum is satisfactorily suppressed in the aluminum layer-forming stage, and the thus obtained solar cell has satisfactory electrical characteristics. Mean-while, if the aforementioned weight ratio (aluminum/$B_2O_3$) is 100/192 or higher, the resistance of the aluminum cover layer after firing is low and the obtained solar cell exhibits excellent electrical characteristics.

Moreover, the aforementioned weight ratio (aluminum/$B_2O_3$) can be calculated from the blending quantities of the aluminum component and the boron component when the paste is prepared. Alternatively, the quantities of the components in the aluminum cover layer following firing can be measured. For example, using ICP emission spectral analysis (ICP-OES/ICP-AES), the aforementioned weight ratio (aluminum/$B_2O_3$) can be obtained by measuring emission lines discharged when plasma energy is applied externally to a sample.

Second Aluminum Paste

In one embodiment, the aluminum cover layer is formed from the second aluminum paste comprising aluminum and boron compound.

The aforementioned boron compound means a compound that forms $B_2O_3$ when boron in the compound is oxidized by firing under prescribed temperature conditions. Boron generally forms boron oxide when oxidized at approximately 400° C. Therefore, by firing under prescribed temperature conditions, such as a temperature that exceeds 400° C., boron contained in the aforementioned second aluminum paste is oxidized to form boron oxide ($B_2O_3$). In this case, because a reducing action against the aluminum contained in the aforementioned second aluminum paste operates, oxidation of the aluminum contained in the second aluminum paste is effectively suppressed.

In addition, boron oxide ($B_2O_3$) in the second aluminum paste forms a glass-like film following such firing. Therefore, by coating the second aluminum paste on the first aluminum paste and then firing, the glass-like film is gradually formed on the first aluminum paste during the firing process. Because the thus formed glass-like film covers the first aluminum paste during the firing, oxidation of the aluminum contained in the first aluminum paste is effectively suppressed during the firing. For reasons such as these, but not limited to such reasons, oxidation of aluminum in the aluminum electrode is also effectively suppressed by firing and a solar cell able to exhibit excellent electrical characteristics is provided. The glass-like film formed by this firing becomes the aforementioned aluminum cover layer following the firing.

Specific examples of the aforementioned boron compound include boron (crystalline or amorphous), boric acid ($H_3BO_3$), boron trioxide ($B_2O_3$), borax ($Na_2B_4O_5$), borate esters such as tributyl borate, tripropyl borate and triethyl borate, boronic acids such as hexyl boronic acid and 3-acetylphenyl boronic acid, and organic boron compounds such as boronate esters, borinate esters and borane. One of these boron compounds or a combination of two or more thereof may be used. If elemental boron is used, the purity of the boron particles is 95 wt % or higher in certain embodiments and 99 wt % or higher in other embodiments.

In one embodiment, the content of the aforementioned boron in the compound in the aforementioned second aluminum paste can be such that the weight ratio (Al/B) is between 100/1.2 and 100/60.0 if calculated in terms of boron contained in said boron compound. In another embodiment, the weight ratio (Al/B) can be between 100/2.0 and 100/58.0. In yet another embodiment, the weight ratio (Al/B) can be between 100/2.3 and 100/58.0.

If the content of the aforementioned boron compound in the aforementioned second aluminum paste falls within the above-mentioned ranges, oxidation of aluminum during the firing process is satisfactorily suppressed, the aluminum cover layer obtained following the firing exhibits an excellent resistance value, and excellent electrical characteristics can therefore be achieved.

The aluminum powder, glass frit, organic medium, and additives in the second aluminum paste, which can be used to form the aluminum cover layer, are the same as those mentioned in relation to the aluminum base layer.

A Method for Manufacturing a Solar Cell

Next, an example in which a solar cell having a back-side aluminum electrode of the present invention is prepared using the above aluminum pastes is explained, referring to the FIG. 1.

First, a silicon wafer 102 is prepared. Electrodes 104 are formed on the light-receiving side of the silicon wafer 102 (FIG. 1A). In an embodiment, electrodes 104 are formed after or at the same time of forming the aluminum electrode 110 on the back side of the silicon wafer. The silicon wafer has a p-n junction in the vicinity of the light-receiving side in an embodiment. Electrodes 104 comprise silver as the main conductive component in an embodiment.

Figure 1B:
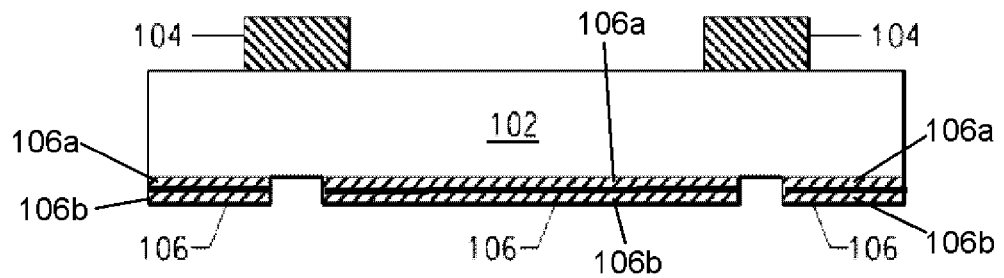
Figure 1C:
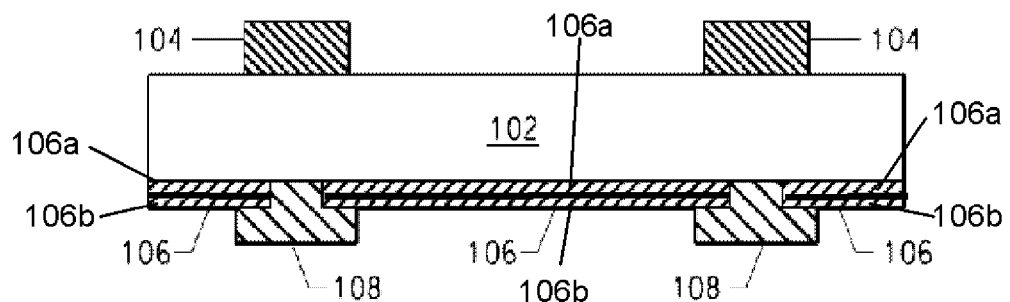

On the back-side of silicon wafer 102, the aluminum paste is spread in a pattern (FIG. 1B). FIG. 1B shows aluminum paste 106 for back side electrodes printed on silicon wafer 102. The first aluminum paste 106*a*, which is used for forming the aluminum base layer, comprises aluminum. The second aluminum paste 106*b*, which is used for forming the aluminum cover layer, comprises aluminum and boron compound.

The first aluminum paste 106*a* may be coated on the entire back-side of silicon wafer 102. The first aluminum paste 106*a* may be coated on a passivation layer in a case the back-side of silicon wafer 102 is partially covered by the passivation layer. The passivation layer comprises $Si_3N_4$, $Al_2O_3$, or $TiO_2$ in an embodiment.

Paste 106*a* may be coated, for example, by screen printing, then dried. The drying temperature of aluminum paste 106*a* is 150° C. or lower for 5-10 minutes, in one embodiment. On the dried first aluminum paste 106*a*, the second aluminum paste 106*b* may be coated, for example, by screen printing, then dried. The drying temperature of aluminum paste 106*b* is 150° C. or lower in drier for 5-10 minutes, in one embodiment.

Then, Ag paste 108 may be spread by screen printing using the pattern that slightly overlaps the aluminum paste 106*b* referred to above (FIG. 1C), then dried. The drying temperature of Ag paste 108 is 150° C. or lower in drier for 5-10 minutes, in one embodiment.

In one embodiment, the aluminum paste has a dried film thickness of 5-30 µm. In another embodiment, the thickness of the aluminum paste is 8-25 µm. Also, the overlapped width of the aluminum paste and the silver electrode conductive paste is about 0.5-2.5 mm in an embodiment.

Figure 1D:
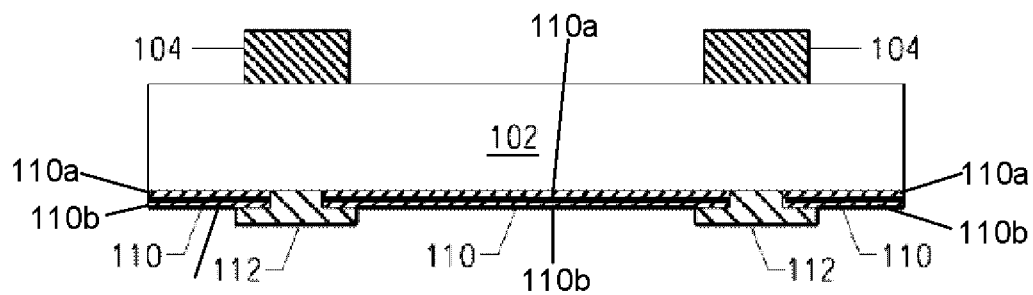

Next, the printed wafer obtained is fired at a temperature of 600-900° C. for about 1 min-15 min, for instance, so that the desired solar cell is obtained (FIG. 1D). The firing temperature is defined as the peak temperature in the surrounding atmosphere of the fired pastes during the firing process. In another embodiment, the first aluminum paste 106*a* and the second aluminum paste 106*b* is fired separately. Namely, the first aluminum paste is fired prior to the firing of the second aluminum paste. An electrode is formed from the pastes wherein said composition has been fired to remove the organic medium and sinter the glass frit. The solar cell obtained using the aforementioned aluminum paste, as shown in FIG. 1D has electrodes 104 on the light-receiving side of the silicon wafer 102, aluminum electrodes 110, comprising aluminum base layer 110*a* formed from aluminum paste 106*a* and aluminum cover layer 110b formed from aluminum paste 106b, and electrodes 112 formed from Ag paste on the back side of substrate 102.

In one embodiment, the thickness of the aluminum electrode is equal to or more than 10.0 μm, equal to or more than 12.0 μm in another embodiment. If the aforementioned film thickness is no less than 10 μm, a BSF having good performance can be formed and a deterioration in open circuit voltage, conversion efficiency (Eff %) can be prevented.

The aluminum cover layer 110b means the layer formed after the firing, as mentioned above, and contains boron oxide ($B_2O_3$) at a content of 100/192 to 100/3.2 relative to aluminum. Therefore, the obtained aluminum electrode 110 is formed due to oxidation of aluminum being effectively suppressed. This back-side electrode of a p-type solar cell exhibits excellent electrical characteristics.

The present invention will be discussed in further detail by giving practical examples. The scope of the present invention, however, is not limited in any way by these practical examples.

EXAMPLE

Although the following provides an explanation of the present invention through examples thereof, the present invention is not limited to these examples.

Solar cells were formed as follows:
(1) Manufacturing
  (i) Aluminum Paste(s) Preparation
  The aluminum pastes were prepared using the following materials.
<Materials>
(a) Aluminum powder: (The mean particle size (D50) of the aluminum powders=2.5 μm or 5.8 μm)
(b) Boron powder: The mean particle size (D50) of the boron powders=5.8 μm)
(c) Organic medium: (5.6 wt % solution of ethyl cellulose resin dissolved in terpineol)
<Procedure of the Preparations>
Aluminum paste preparations were accomplished with the following procedure.

As for the first aluminum paste, aluminum powders described in the corresponding columns of Table 1 were dispersed in the organic medium and mixed by mixer for 120 minutes. The contents of the aluminum powders were shown in Table 1. The degree of dispersion was measured by fineness of grind (FOG). A typical FOG value was generally equal to or less than 20/10 for a conductor.

Likewise, the second aluminum pastes were prepared. That is to say, as for the second aluminum paste, aluminum powders and boron powders described in the corresponding columns of Table 1 were dispersed in the organic medium and mixed by mixer for 120 minutes. The contents of the aluminum powders and boron powders were shown in Table 1.

(ii) Solar Cell Preparation (Sample Preparation)
  On the front-side of a silicon wafer (200 μm thick multicrystalline silicon wafer of area 14.44 $cm^2$ p-type (boron) bulk silicon, with an n-type diffused $POCl_3$ emitter, surface texturized with acid, $SiN_x$ anti-reflective coating (ARC) on the wafer's emitter applied by CVD), silver pastes (PV159 Ag composition commercially available from E.I. Du Pont de Nemours and Company) were printed and dried so as to form front-side electrodes having 20 μm thickness. Then, the first aluminum paste prepared in (i) was coated by screen printing on the entire back-side of the silicon wafer, then dried. The drying temperature was 150° C. in drier, for 10 minutes. Then, on the dried first aluminum paste, the second aluminum paste was coated by screen printing, then dried. The drying temperature was 150° C. in drier, for 10 minutes. After that, the printed wafers were then fired in a Dispatch furnace at a belt speed of 550 cm/min. The wafers reached a peak temperature of 740° C. After firing, the metalized wafer became a functional solar device. The thickness of the Al layers of the samples (Examples 1-5 and Comparative Examples 1-2) after firing were shown in Table 1. The weight ratio (aluminum/$B_2O_3$) in aluminum cover layer of the samples (Examples 1-5 and Comparative Examples 1-2) after firing were shown in Table 1.

(2) Test Procedures—Electric Performance
2-1) Measurement of Open Circuit Voltage (Voc)

Each sample of solar cells (Examples 1-5 and Comparative Example 1-2) formed according to the method described above were placed in a commercial I-V tester (supplied by NPC.) for the purpose of measuring light conversion efficiencies. The lamp in the I-V tester simulated sunlight of a known intensity (approximately 1000 $W/m^2$) and illuminated the emitter of the cell. The electrodes formed on the fired cells were contacted by four electrical probes. The photocurrent (Voc, open circuit voltage; Isc, short circuit current) generated by the solar cells was measured over arrange of resistances to calculate the I-V response curve. Voc values were subsequently derived from the I-V response curve.

2-2) Evaluation Based on Open Circuit Voltage Value (Voc)
The Voc values obtained from the sample measurements for each example as described above were evaluated in comparison with the open circuit voltage value (Voc) obtained from the sample measurements of Comparative Example 2. The results are shown in Table 1.

TABLE 1

| | First aluminum paste | | | Second aluminum paste | | | | | Thickness of AL layers (electrode) (μm) | | Weight ratio (aluminum/$B_2O_3$)in | |
|---|---|---|---|---|---|---|---|---|---|---|---|---|
| Ex.No | Al Powders (wt %) | D(50) of Al Powders (μm) | Organic medium (wt %) | Al Powders (wt %) | D(50) of Al Powders (μm) | B Powders (wt%) | Organic medium (wt%) | Weight ratio (Al/B) | aluminum base layer | aluminum cover layer | aluminum cover layer after firing | ΔVoc (%) |
| Ex. 1 | 64.3 | 2.5 | 35.7 | 68.4 | 5.8 | 1.6 | 30.0 | 100/2.3 | 22.5 | 24 | 100/5 | 0.73 |
| Ex. 2 | 64.3 | 2.5 | 35.7 | 66.0 | 5.8 | 3.5 | 30.5 | 100/5.3 | 22.5 | 23 | 100/17 | 0.58 |
| Ex. 3 | 64.3 | 2.5 | 35.7 | 59.7 | 5.8 | 8.4 | 31.9 | 100/14.1 | 22.5 | 20 | 100/45 | 0.52 |
| Ex. 4 | 64.3 | 2.5 | 35.7 | 60.5 | 5.8 | 13.2 | 31.9 | 100/21.8 | 22.5 | 20 | 100/70 | 0.40 |
| Ex. 5 | 64.3 | 2.5 | 35.7 | 44.3 | 5.8 | 25.7 | 30.0 | 100/58.0 | 22.5 | 13.5 | 100/186 | 0.21 |

TABLE 1-continued

| | First aluminum paste | | | Second aluminum paste | | | | | Thickness of AL layers (electrode) (μm) | | Weight ratio (aluminum/ B$_2$O$_3$)in | |
|---|---|---|---|---|---|---|---|---|---|---|---|---|
| Ex.No | Al Powders (wt %) | D(50) of Al Powders (μm) | Organic medium (wt %) | Al Powders (wt %) | D(50) of Al Powders (μm) | B Powders (wt%) | Organic medium (wt%) | Weight ratio (Al/B) | aluminum base layer | aluminum cover layer | aluminum cover layer after firing | ΔVoc (%) |
| Co.Ex. 1 | 64.3 | 2.5 | 35.7 | 70.5 | 5.8 | — | 29.5 | 100/0 | 22.5 | 24 | 100/0 | −0.19 |
| Co.Ex. 2 | 77.5 | 5.8 | 22.5 | | | | | | 40 | — | 100/0 | 0(STD) |

What is claimed is:

1. A solar cell comprising:
    a p-doped silicon wafer, wherein the p-doped silicon wafer comprises a light-receiving side and a back side; and
    an aluminum electrode formed on the back side of the silicon wafer;
    wherein the aluminum electrode comprises an aluminum base layer formed adjacently on the back side of the silicon wafer and an aluminum cover layer formed on the aluminum base layer, and
    wherein the aluminum cover layer comprises aluminum and boron oxide (B$_2$O$_3$).

2. A solar cell of claim 1, wherein the weight ratio (aluminum/B$_2$O$_3$) in the aluminum cover layer is 100/192-100/3.2.

3. A solar cell of claim 2, wherein the weight ratio (aluminum/B$_2$O$_3$) in the aluminum cover layer is 100/80-100/3.2.

4. A solar cell of claim 1, wherein thickness of the aluminum electrode is equal to or more than 10.0 μm.

5. A solar cell of claim 1, wherein a passivation layer is formed on the silicon layer between the p-doped silicon wafer and the aluminum electrode.

6. A solar cell of claim 1, wherein the aluminum base layer is substantially free of boron oxide.

7. A method for manufacturing a solar cell, comprising the steps of:
    preparing a p-doped silicon wafer, wherein the p-doped silicon wafer comprises a light-receiving side and a back side;
    applying a first aluminum paste comprising aluminum on the back side of the p-doped wafer;
    applying a second aluminum paste comprising aluminum and boron compound; and
    firing the first aluminum paste and the second aluminum paste to form an aluminum electrode comprising an aluminum base layer and an aluminum cover layer that derives from the first aluminum paste and the second aluminum paste respectively,
    wherein the boron compound is oxidized to boron oxide (B$_2$O$_3$) during the firing.

8. A method of claim 7, wherein the boron compound is selected from the group consisting of boron, boric acid (B(OH)$_3$), boron trioxide (B$_2$O$_3$), borax (Na$_2$B$_4$O$_5$), borate ester, boronic acid, and organic boron compound.

9. A method of claim 7, wherein the first aluminum paste and the second aluminum paste are fired at the same time.

10. A method of claim 7, the first aluminum paste is fired prior to the firing of the second aluminum paste.

11. A method of claim 7, wherein the first aluminum paste and the second aluminum paste are fired at 600-900° C.

12. A method of claim 7, wherein the weight ratio (aluminum/B$_2$O$_3$) in the aluminum cover layer is 100/192-10013.2

13. A method of claim 12, wherein the weight ratio (aluminum/B$_2$O$_3$) in the aluminum cover layer is 100/80-100/3.2.

14. A method of claim 7, wherein thickness of the aluminum electrode is equal to or more than 10.0 μm.

15. A method of claim 7, further comprising a step of forming a passivation layer on the silicon layer between the p-doped silicon wafer and the aluminum electrode.

16. A method of claim 7, wherein the first aluminum paste is substantially free of boron.

* * * * *